United States Patent
Dreibelbis et al.

[11] Patent Number: 5,875,470
[45] Date of Patent: Feb. 23, 1999

[54] MULTI-PORT MULTIPLE-SIMULTANEOUS-ACCESS DRAM CHIP

[75] Inventors: Jeffrey Harris Dreibelbis, Williston; Wayne Frederick Ellis, Jericho, both of Vt.; Thomas James Heller, Jr., Rhinebeck; Michael Ignatowski, Red Hook, both of N.Y.; Howard Leo Kalter, Colchester, Vt.; David Meltzer, Wappingers Falls, N.Y.

[73] Assignee: International Business Machines Corporation, Armonk, N.Y.

[21] Appl. No.: 841,029

[22] Filed: Apr. 29, 1997

Related U.S. Application Data

[63] Continuation of Ser. No. 535,395, Sep. 28, 1995, abandoned.

[51] Int. Cl.$^6$ ........................................ H01L 29/78
[52] U.S. Cl. ........................ 711/147; 711/5; 711/105; 711/148; 711/149; 711/150
[58] Field of Search ........................ 711/5, 105, 147, 711/148, 149, 150, 167, 168

[56] References Cited

U.S. PATENT DOCUMENTS

| | | | |
|---|---|---|---|
| 4,745,545 | 5/1988 | Schiffleger | 395/477 |
| 5,043,874 | 8/1991 | Gagliardo et al. | 395/478 |
| 5,261,059 | 11/1993 | Hedberg et al. | 395/312 |
| 5,440,713 | 8/1995 | Lin et al. | 395/485 |
| 5,514,884 | 5/1996 | Hively et al. | 257/203 |

*Primary Examiner*—Eddie P. Chan
*Assistant Examiner*—Than V. Nguyen
*Attorney, Agent, or Firm*—Marc A. Ehrlich; Bernard M. Goldman

[57] ABSTRACT

Provides within a semiconductor chip a plurality of internal DRAM arrays connected to each section data bus. A crosspoint switch simultaneously connects the plural section data buses to a corresponding plurality of port registers that transfer data between a plurality of ports (I/O pins) on the chip and the section data buses in parallel in either data direction to effectively support a high multi-port data rate to/from the memory chip. For any section, the data may be transferred entirely in parallel between the associated port and a corresponding port register, or the data may be multiplexed between each port and its port register in plural sets of parallel bits. Each of the DRAM banks in the chip is addressed and accessed in parallel with the other DRAM banks through a bank address control in the chip which receives all address requests from four processors in a computer system. Each section data bus is comprised of a large number of data lines that transfer data bits in parallel to/from all of DRAM cells in an address-selected row in one of the DRAM banks at a time in each section. The four DRAM section buses in the chip may be transferring data at the same time in independent directions to/from the four chip ports.

11 Claims, 6 Drawing Sheets

```
BIT POSITION IN ADDRESS:

0 1 2 3 4 5 6 7 8 9 0 1 2 3 4 5 6 7 8 9 0 1 2
 |-|-|-|-|-|-|-|-|-|-|-|-|-|-|-|-|-|-|-|-|-|-|   22 BIT BYTE ADDRESS
 |-|-|-|-|-|-|-|-|-|-|-|-|-|-|-|-|-|-|-|         19 BIT ADDRESS TO CHIP
                                     |-|         2 BIT PROC-ID
 |-|-|-|-|-|-|-|-|-|                             9 BITS TO SELECT ROW IN BANK
                   |-|                           2 BITS TO SELECT SECTION
                       |-|                       2 BITS TO SELECT BANK
                           |-|                   1ST OF 3 BITS TO SELECT PAGE IN
                                                 SENSE AMPLIFIER LATCHES
                             |-|                 2ND & 3RD OF 3 BITS TO SELECT PAGE
                                                 WITHIN SENSE AMPLIFIER LATCHES
                                 |-|             3 BITS TO SELECT 8 BYTES
                                                 FROM PORT REGISTER
```

MULTI-PORT MULTIPLE-SIMULTANEOUS-ACCESS DRAM CHIP

This application is a continuation of application Ser. No. 08/535,395, filed Sep. 28, 1995, now abandoned.

INTRODUCTION

This invention relates to a multi-port multi-bank memory architected to enable manufacture of the memory in a single DRAM chip having a plurality of input/output ports and being capable of handling a large number of accesses in parallel.

BACKGROUND

The prior art has a multitude of single-port single-bank DRAM memory chips and of memory configurations of such memory chips in single-port and multiple-port arrangements. However, the prior art is not known to disclose any single chip architecture for structuring a single DRAM semiconductor chip with multiple ports and multiple DRAM banks—which is the primary object of the subject invention. A clear distinction needs to be made between different types of memory chips.

For example, U.S. Pat. No. 4,745,545 shows a memory using memory banks which "the memory banks are organized into each section of memory in a sequential and interleaved fashion", which is not the way the internals of the subject invention are organized (and in which it is believed that each memory bank may be a separate chip). U.S. Pat. No. 4,745,545 focuses on having unidirectional ports (read or write), and on conflict resolution among its ports, and on supporting an interleaved memory for multiple processor accesses, which is not a focus within the chip of the subject invention which does not have unidirectional ports.

SUMMARY OF THE INVENTION

The invention provides an architecture for a semiconductor chip containing multiple bidirectional ports supporting a plurality of independent DRAM banks all packaged in the single chip. This invention can support access requests from plural processors, or plural execution units, connected to different ports of the chip. Simultaneously independent accesses may be made in the separate DRAM banks within the chip without causing conflict among parallel requests to different sections of the memory within the chip. Any conflict among parallel requests to the same section of the memory may be resolved within the chip. This invention is not concerned with access conflict resolution made outside of the memory chip.

Access parallelism provided within the memory semiconductor chip of this invention enables a high data rate to/from the chip to an extent that enables the chip to replace a more expensive SRAM (static random access memory) in a memory hierarchy of a computer system. For example, the chip may be used as a second level (L2) cache communicating data in parallel to/from plural processor private caches in a computer system.

Access requests to the memory chip may be made by multiple execution units and/or instruction unit(s) in the same processor, or by different processors; and the processors may be of any type, such as central processors and I/O processors, etc. The single chip architecture of this invention results in a complex high-speed memory packaged in a smaller semiconductor die size than for chips using either SRAM or CDRAM technology for equivalent high-speed memory capacity. This DRAM single chip architecture allows lower development cost and lower manufacturing complexity than prior memory chips using combined SRAM/DRAM technology (as in Cached DRAM).

A preferred embodiment of this invention combines within a semiconductor chip a plurality of independent memory banks (comprised of DRAM arrays) into multiple memory sections, a cross-point switch for simultaneously connecting plural data buses of the multiple memory sections to a plurality of port registers, and to transfer data between the port register and a plurality of ports on the chip in either data direction to effectively support a high data rate to/from the memory chip. The data may be transferred entirely in parallel between the port and a corresponding port register, or the data may be multiplexed between the port and its port register in sets of parallel bits. Each of the DRAM banks in the chip is independently addressed through a bank address control in the chip which receives all address requests from processors in a computer system.

The banks in the chip are divided into a plurality of memory sections, and all DRAM banks in each section are connected to the same section data bus, which is connected to the matrix switch. Data flows through each data bus into or out of one of the port registers through the matrix switch. Each data bus is comprised of a large number of data lines that transfer data bits in parallel to/from all of DRAM cells in an address-selected row in one of the DRAM banks in the section.

This invention extends the "banking" concept beyond that of prior SDRAM chip technology which uses independent Row Address Strobe (RAS) banks of memory cells, complete with their associated I/O overhead, which are multiplexed onto the output ports. A "memory section" concept used in this invention sub-divides each complete memory section into plural parallel DRAM banks providing parallel address space which time shares the I/O overhead of the section. This architecture realizes DRAM latency advantages in multiprocessor systems without increased secondary data bus overhead (and therefore die area) requirements.

A cross-point switch within the chip is connected between all section data buses and the plurality of port registers. Each port register receives and stores all parallel bits for a row of a bank in any connected section of the chip. Each port register also may be permanently connected to one of a plurality of ports of the chip. Each port is comprised of a plurality of chip I/O pins, each pin transferring a bit of data in or out of the port. The number of parallel bits for each port may be a fraction of the number of data bits stored in parallel by its port register, and this difference may be accommodated by a bit selector located between each port and its port register. The bit selector selects a subset of bits of the register during each cycle for transfer between the port and port register, so that k cycles may be used to multiplex a row of bits between the port register and its port.

An I/O selection control in the chip controls the switching by the cross-point switch—to accommodate a plurality of simultaneous section-bus/port-register data transfers in either direction. When the matrix switch connects the plural section data buses to the plurality of port registers, any section data bus may be connected to any port register. Thus, the I/O selection control may simultaneously connect the data content of a row in one bank in each of the plurality of memory sections to a different one of the plurality of port registers in either direction, in order to pass data in parallel between all ports and all data buses.

The timing of the parallel data transfers between the ports and the banks is synchronized by system timing used by all processors connected to the ports. The processor timing signals are provided to the chip to synchronize the data transfers. Generally, all section data buses may start and end their bank row transfers in the same cycles; the cross-point switch may then switch between the synchronized data bus transfers; and all processors may then synchronously transfer a line of data to/from their assigned ports at the same time.

Extraordinarily high parallelism of both data access and data transfer is provided by the novel DRAM structure of this invention in its multiple-bank, multiple-data-bus structure in a single chip, in which all data-buses may be transferring data in parallel to/from different banks in the chip, while all other banks in the chip may be simultaneously accessing data in parallel with each other and in parallel with all data-bus transfers to/from multiple requesters external of the chip.

The memory access speed of DRAMs and SRAMs is not changed by this invention, and each DRAM memory access remains substantially slower than a SRAM memory access when comparing DRAM and SRAM memories using the same semiconductor manufacturing technology on the same chip size—including in the DRAM structure of this invention.

It is therefore not obvious that the subject DRAM chip structure, operating at the slower access speed of DRAMs, actually can provide substantially faster average memory access on a system-wide basis than can be provided with any conventional SRAM chip structure occupying the same chip size and manufacturing technology. Further, the DRAM chip structure of this invention can provide a significantly better cost/performance than can such SRAM chips.

Yet with the DRAM access time disadvantage, this invention's DRAM shared cache chip nevertheless obtains significantly faster average access time, and a significant cost/performance improvement, over conventional SRAM shared caches—particularly for shared caches of the type commonly called L2 caches in the prior art.

In today's technology, the on-chip data bit density of DRAMs is about 10 times the bit density of SRAMs. Because of the novel DRAM structure of this invention, this DRAM/SRAM density difference enables the extraordinarily high access and transfer parallelism to obtain about a three times better memory-hit ratio compared to a conventional SRAM cache on the same size chip. In this manner, the invention exploits the well-known higher data density of DRAM technology over SRAM technology.

It is therefore not obvious that system level performance can be significantly improved by this DRAM invention with slower processor access to the shared cache. That is, the invention exploits its extraordinary parallelism capability to obtain a very high hit ratio for multiple simultaneous processor accesses to more than makes up for slower individual processor memory accesses.

Accordingly in the unique chip memory structure of this invention, the DRAM density is exploited by its extraordinarily-high parallel accessing and transferring of data to improve performance for the DRAM shared cache even though individual processor accesses are slower.

DESCRIPTION OF THE DETAILED EMBODIMENT

Figure 1A:
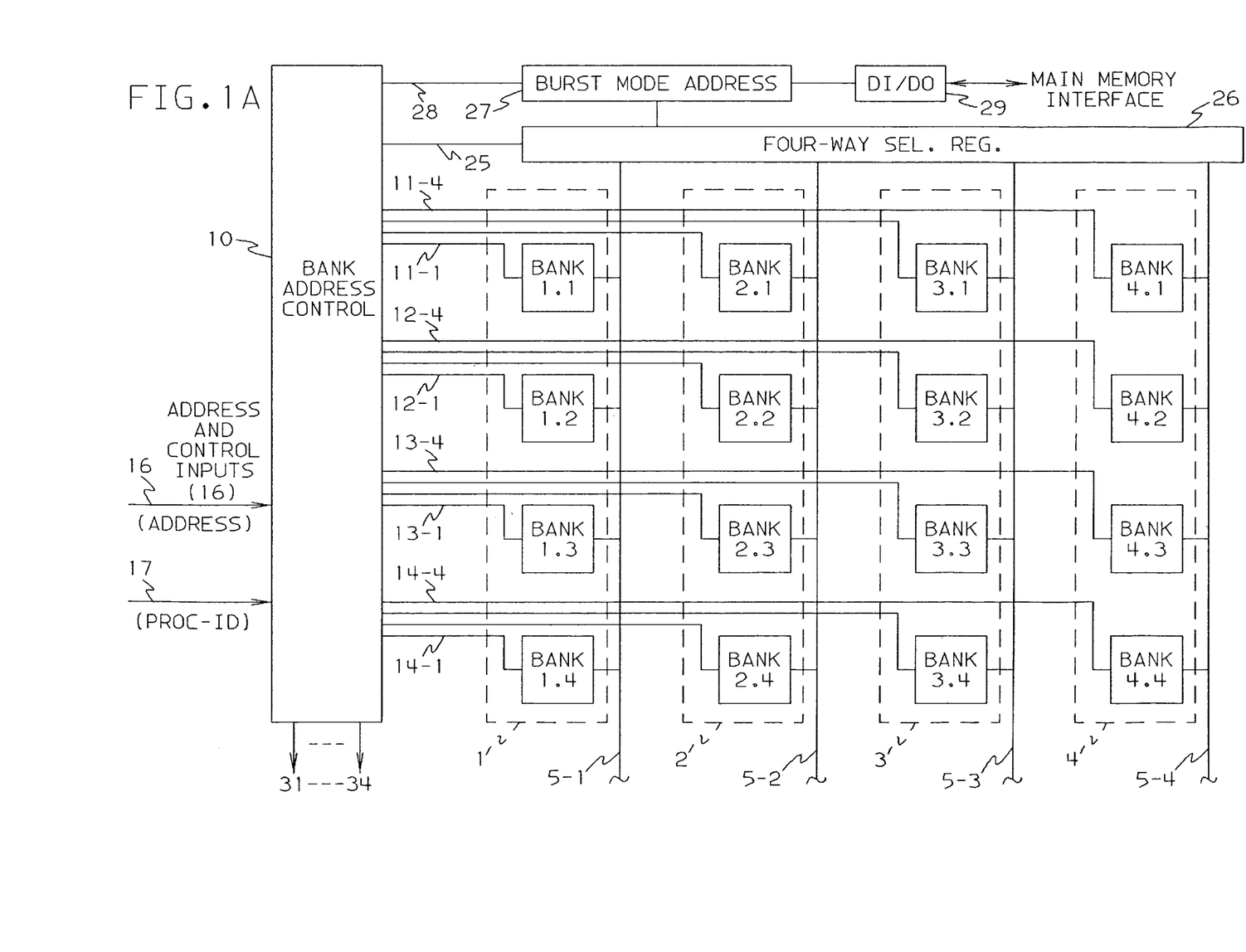
FIGS. 1A and 1B represent a unique DRAM semiconductor chip embodiment structured according to this invention.
Figure 1B:
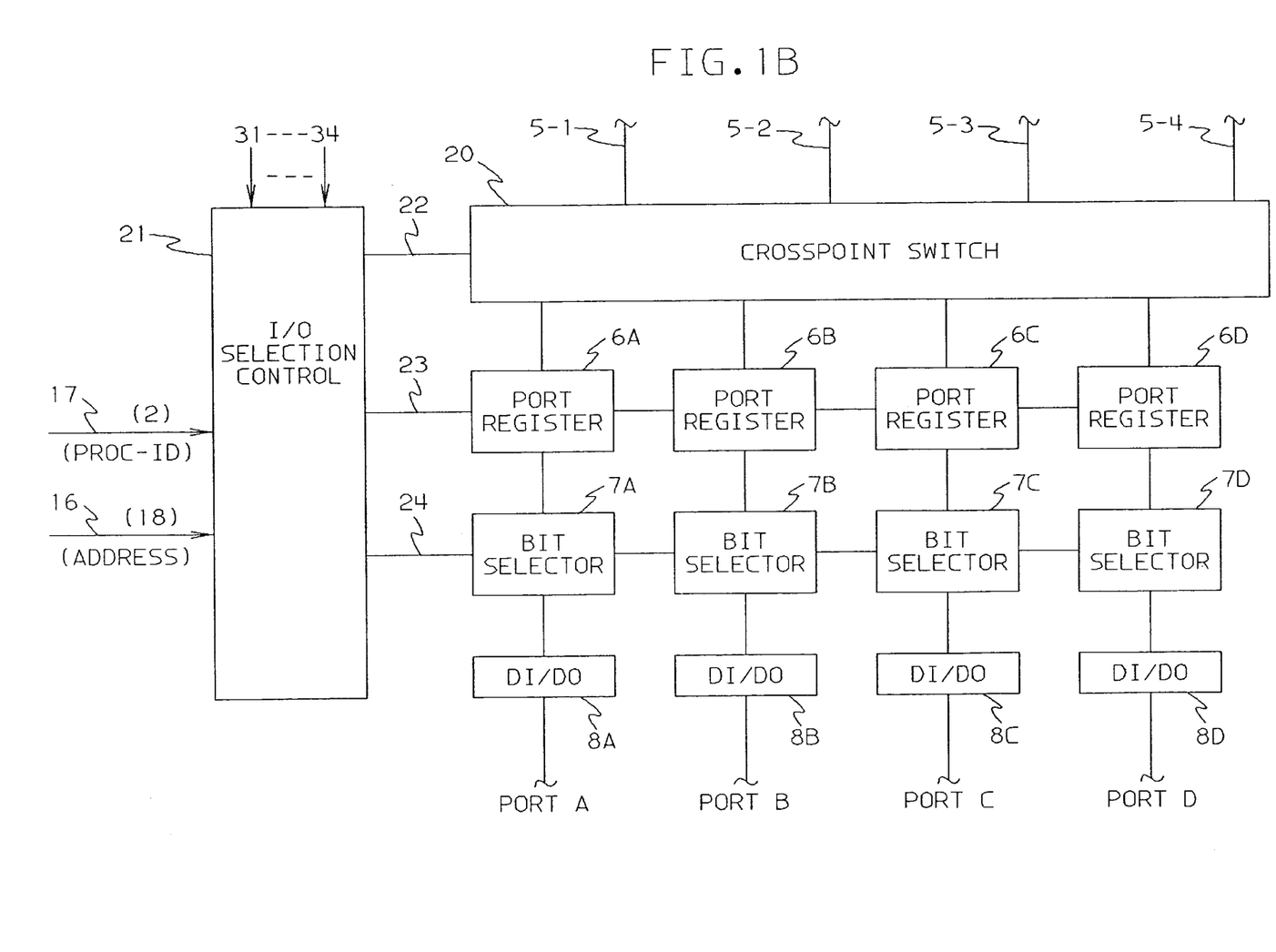

FIGS. 1A and 1B together provide a block diagram of circuit logic showing the structure of a unique DRAM semiconductor chip made according to the teachings of this invention. This chip may contain an entire memory, or may be a part of a memory, for a designated level in a memory hierarchy of a computer system. For example, this one chip may provide an entire second level (L2) memory (L2 cache), accessed by a plurality of processors (central processors and I/O processors) of a computer system. And the chip also may support a level three (L3) main memory of a computer system; and such L3 main memory may be comprised of one or a plurality of chips of the type shown in FIGS. 1A and 1B to accommodate from small to very large main memory sizes.

Figure 3:
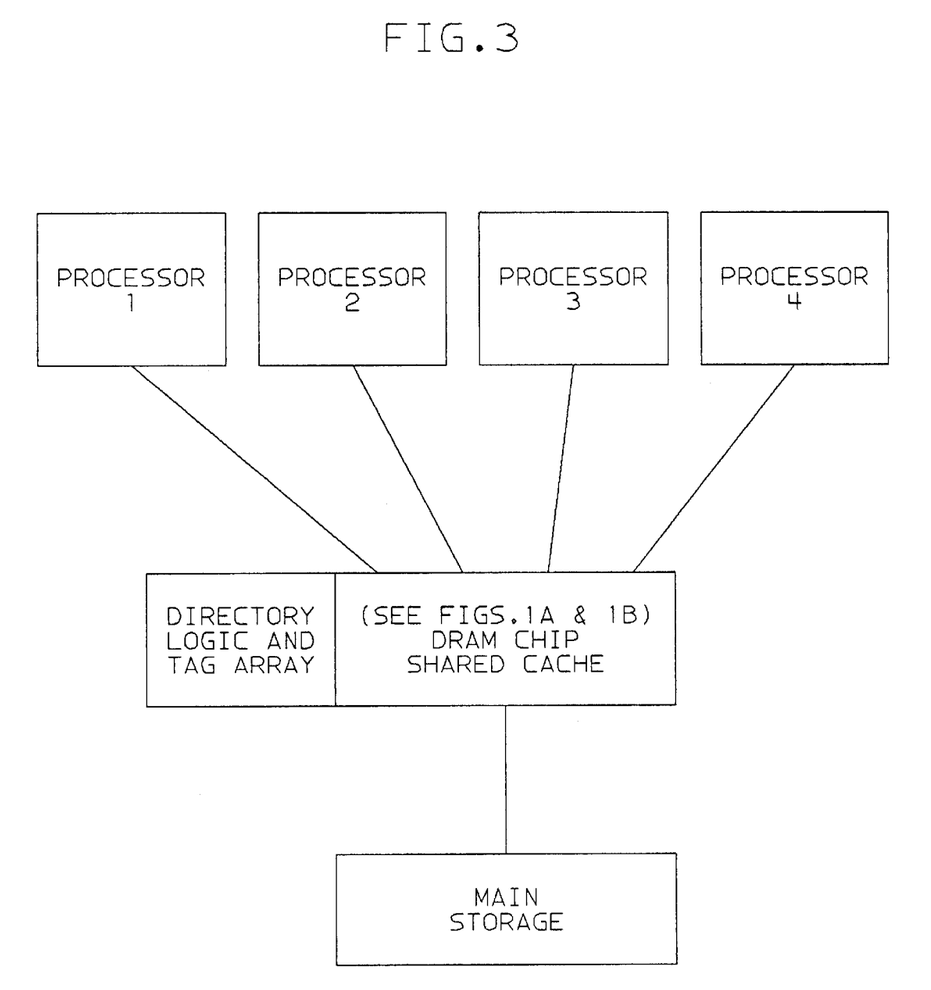
FIG. 3 shows a computer system arrangement which contains an L2 shared cache made of chips of the type shown in FIGS. 1A and 1B.

FIG. 3 is an example of a computer system having four central processors (CPUs) accessing an L2 shared memory (cache) comprised of a single chip of the type as shown in FIGS. 1A and 1B, and accessing a conventional L3 main memory which may be made of conventional DRAM chips.

Figure 4:
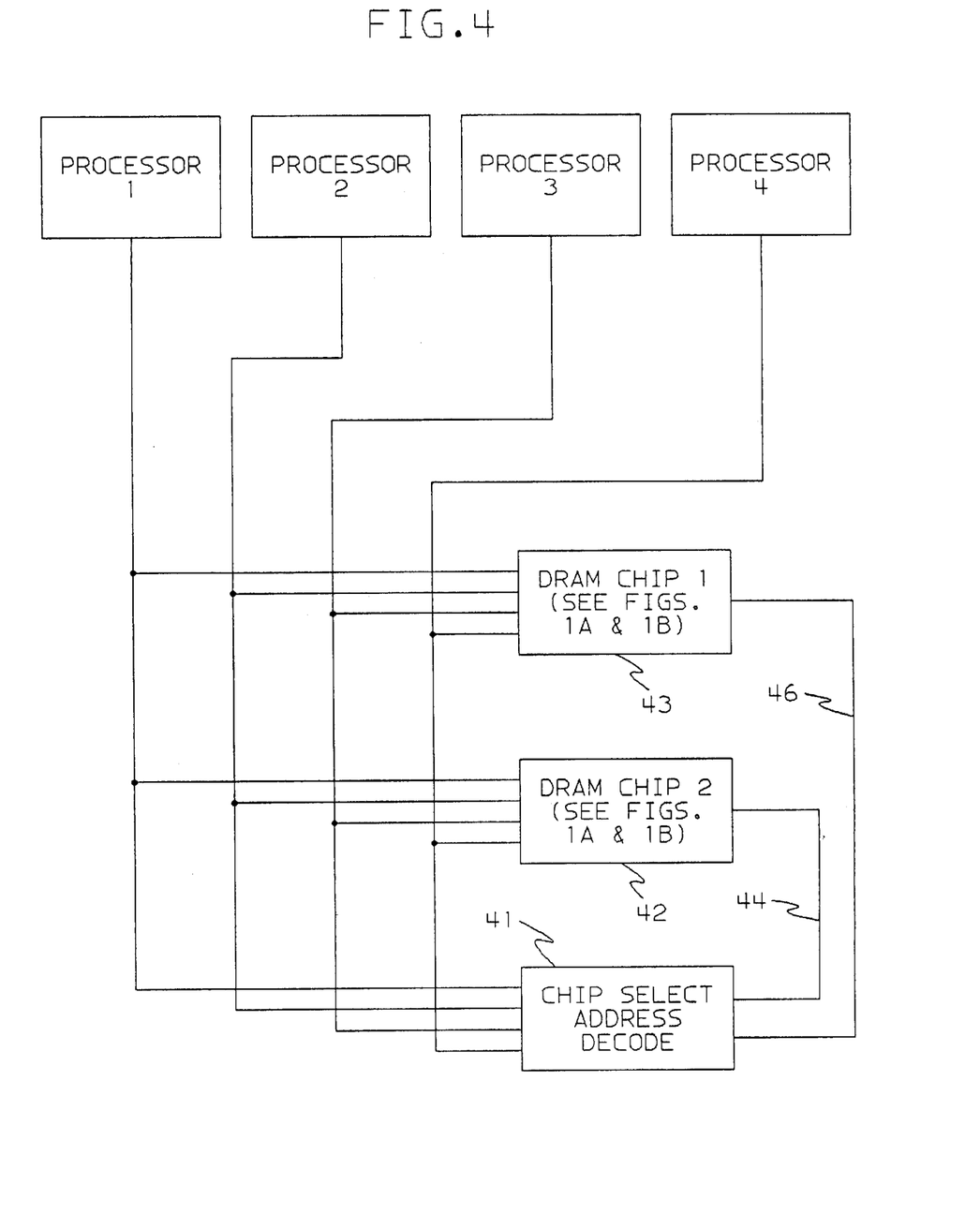
FIG. 4 represents a computer system having an L3 main memory comprised of a plurality of chips of the type shown in FIGS. 1A and 1B.

FIG. 4 shows another computer system having an L3 main memory made of a plurality of chips in which each chip is the type shown in FIGS. 1A and 1B, but without items 25, 26, 27, 28 and 29 being in these chips because these items are not needed in this main memory configuration. No L2 shared cache is represented in the system of FIG. 4. However, a computer system may have both an L2 shared cache and an L3 main memory made from chips of the type shown in FIGS. 1A and 1B.

FIGS. 1A and 1B show the preferred embodiment the chip which contains data storage cells, addressing interface circuits and data interface circuits which may support a multiprocessor having four independently operating central processors (CPUs) and one or more I/O processors. The plural processors may be simultaneously accessing data (reading and/or writing data) in different DRAM storage banks in the chip.

The chip structure shown in FIGS. 1A and 1B is logically divided into distinct parts, including DRAM storage parts shown in FIG. 1A, and an input/output part shown in FIG. 1B. The storage part in FIG. 1A comprises four DRAM memory sections 1, 2, 3 and 4. Each memory section contains four DRAM storage banks connected to one data bus 5. The four storage sections 1, 2, 3, 4 each have a respective data bus 5-1, 5-2, 5-3, 5-4. The four sections therefore have a total of 16 DRAM banks 1.1 through 4.4.

Chip Memory Sections and Bank Addressing

Further, each DRAM bank is connected to a respective one of sixteen address buses 11-1 through 14-4, which are connected to a bank address control 10 within the chip. Bank address control 10 may receive all memory addresses requested by all processors wanting to access data in any of the 16 banks in memory sections 1, 2, 3 and 4. Control 10 may be simultaneously providing plural addresses on buses 11-1 through 11-4 for simultaneously selecting the drivers for one of matrix rows in multiple banks.

Bank address control 10 receives and handles a memory address size compatible with the overall memory size supported by the 16 DRAM banks. For example, the 2304 bit matrix line size supports a chip byte line size (at the chip I/O interface) of 256 nine bit bytes, or of 288 eight bit bytes (256×9=2304) or (288×8=2304), depending whether each chip byte uses an extra bit as a parity error check bit. Hereafter in this specification the 256 byte line is used, since parity checking is desired in the preferred embodiment.

The manner of memory address assignment to the banks is subject to the manner in which the memory is being used in a system. The preferred embodiment presumes that a unique byte address is assigned to each byte of 9 bits (8 data and 1 parity) in the memory; consecutive numbers may be assigned as memory real addresses—from 0 through a maximum byte address available in the memory chip. Each of the sixteen memory banks may be assigned a unique block of consecutive byte addresses, and this assignment is presumed to have been made in the preferred embodiment.

Figure 5:
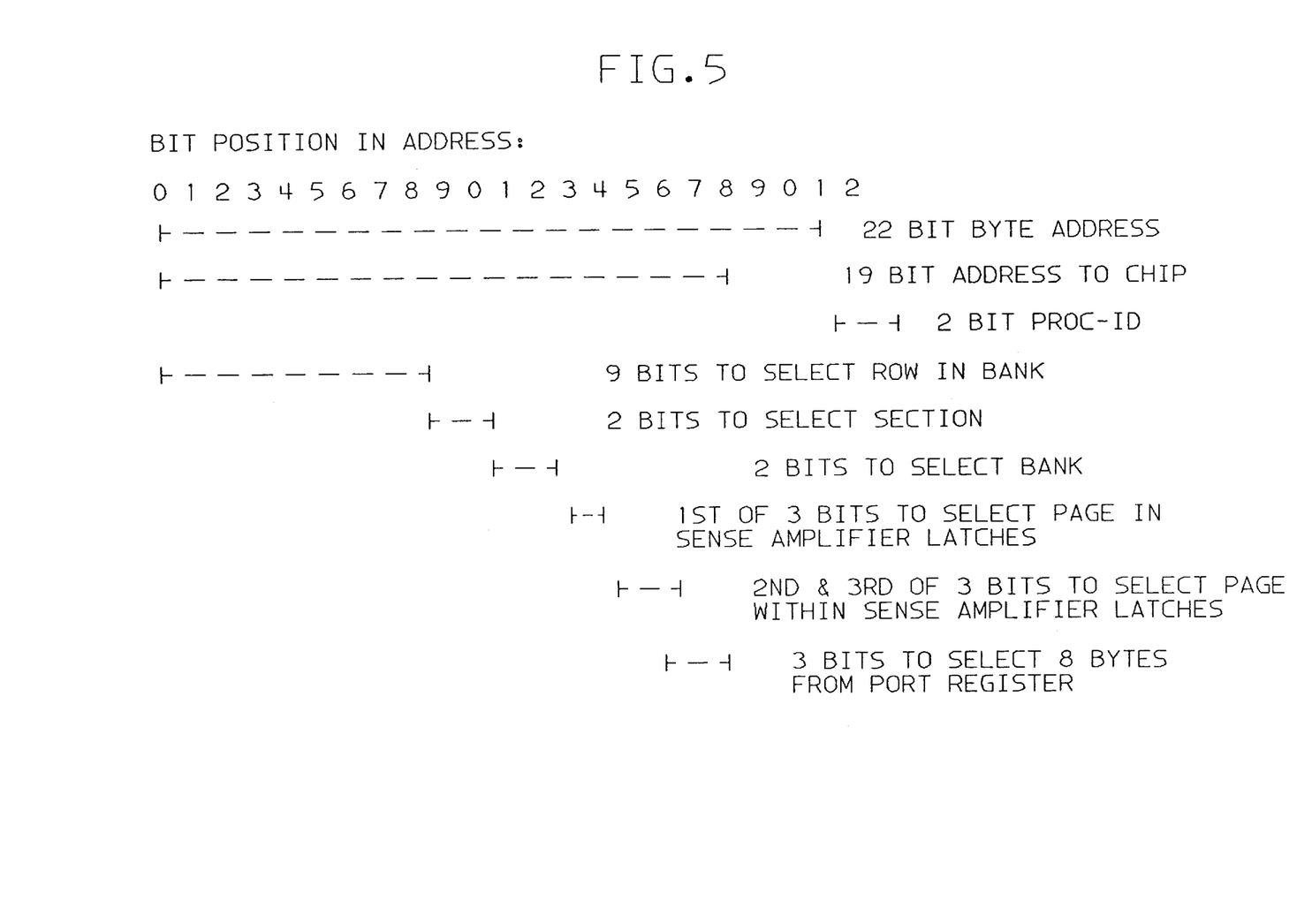
FIG. 5 is an address-bit diagram showing relative positions of subgroups of bits in a received processor address, and operations of these subgroups in accessing a row of data bits within the chip represented in FIGS. 1A and 1B.

The division of the bits in each received address is represented in FIG. 5, which is discussed later herein.

Each address to be accessed in the chip is received at a set of chip address pins (they could be received serially multiplexed over one or more pins or in parallel on a set of pins). Internal to the chip, the chip address pin(s) are connected by an address bus 16 to the bank address control 10. Address control 10 contains conventional circuits (not shown) which detect the bank address ranges assigned to each of the sixteen banks to select the one of the bank address buses 11-1 through 14-4 which has the row of DRAM cells assigned the received byte address. Control 10 also has a busy latch for each bank which can be selected only if its busy latch is set to a non-busy state.

If any bank is busy when it receives an address, control rejects the address by sending a rejection signal on bus 16 to the sending processor so that it can resend the address as a new request until it finds the required bank in an unbusy state in which case the address is accepted and the bank latch is set to a busy state.

In the preferred embodiment, the chip is used as a shared cache (L2) in a computer system (not shown) having four central processors (CPUs) which may be called CPUs A, B, C and D. Computer configurations with L2 caches are well known. In this embodiment, the memory chip has four ports A, B, C and D which are respectively assigned to CPUs having the like letter designations—port A handles all accesses for CPU A, port B handles all accesses for CPU B, etc. Thus in this embodiment, all L2 cache data accesses of a respective CPU are transferred through its permanently assigned port.

Bank timing

Only a very short time is needed for control 10 to receive an address from bus 16, and to select and transmit the address to a required bank compared to the amount of time required for that bank to access the requested row of data having that address. Consequently, bank address control 10 may receive and send many addresses to many different banks during the time that one bank is accessing data.

The object of the plural memory sections is to try to maintain all banks accessing data simultaneously. This invention allows a synchronous timing relationship to be directly used among the different memory sections—to enable one bank in each of memory sections 1, 2, 3 and 4 to be simultaneously transferring data in either direction on the four data buses. In this embodiment, data transfers by banks in different sections start and end together during a transfer cycle sequence. For example, each bank may transfer a line of data in a sequence of four machine cycles, in which a bank in each section starts its transfer in cycle 1 and ends the transfer of the line in cycle 4. The transfer cycles may be driven by the same system clock that drives all processors in the system.

There is no conflict among four simultaneous data transfers by four banks (one per memory section), since the data in each section is for an independent processor in the embodiment.

Requests from the multiple processors are received by bank address control 10 which handles the requests in a first-in-first-out (FIFO) order for each processor in selecting banks for the requests. Each bank is assigned a unique range of addresses in the sequence of addresses represented in the chip memory. If a next processor request is received for a bank while it is has an active request, the next request must wait in control 10 until the required bank becomes non-busy (available), which happens when it completes its current request.

It is theoretically possible to have all 16 banks of the chip in a busy state at the same time. It generally takes each bank several cycles to perform the DRAM operations to access a row of data and latch the row in the bank's buffer latches. These DRAM operations may occur in parallel in the banks of different sections, and they may overlap each other in the four banks of each section.

In this embodiment, each DRAM bank accesses a row of 4608 data bits which are latched into DRAM sense-amplifier latches in the bank, and a DRAM cell matrix restore operation may begin. The data restore process and the data transfer to/from these latches are independent of each other. During the next cycle of the connected data bus, a group of 576 data bits (one eighth of the 4608 bit row) may be transferred between the sense-amplifier latches in the bank and a selected one of four output port registers 6A, 6B, 6C or 6D through a cross-point switch 20 shown in FIG. 1B to transfer the data to/from data I/O ports A, B, C and D on the chip. One half of a latched row (2304 bits) may provide the bank input/ouput for a single access request—which is transferred on the connected section data bus as four "page" groups of 576 bits.

Thus, the four data section buses 5-1, 5-2, 5-3 and 5-4 each have transfer cycle sequences for their respective banks. These four data buses have their transfer cycle sequences operate in parallel and they are synchronized with each other. The first transfer cycles start at the same time for all data buses. During the first cycle, control 10 accesses in its association table for the row of entries to be next serviced for a transfer between banks and ports.

However, not all four sections may have banks simultaneously in operation, depending on the request activity from the processors. Anywhere from one to four banks may be simultaneously making transfers to/from port registers on the respective section data buses during any of the synchronized transfer cycle sequences. Accordingly, up to four of the section data buses may be making data transfers in parallel.

Controls in Bank Address Control 10

The L2 cache embodiment operates with a fixed port/CPU relationship. Each requesting processor provides a two-bit processor identifier (PROC-ID) on a PROC-ID bus 17 to bank address control 10 when the processor sends a requested byte address on bus 16 to control 10. Control 10 uses the byte address to select the one of the sixteen banks containing the requested address, stores in an association table the PROC-ID, the bank identifier of the selected bank, and its section identifier. Control 10 then initiates the selected bank to access its row containing the requested data.

In this embodiment, the PROC-ID assignment to a bank determines the port which must handle the bank data transfer resulting from the request, due to the embodiment's permanent assignment of ports to processors. The association table in control 10 maintains the current bank/processor assignments for each of the active banks in the chip.

The association table may be organized in four columns, one column per PROC-ID, comprising columns A, B, C and D for the four ports that correspond to the processors in this embodiment. Each row in the association table may be used with each parallel transfer cycle sequence synchronized for all of the four section data buses. A next row in the table may be used to control the next transfer sequence when the transfers are completed for the prior row in the table. After the last row is used, the first row may be re-used next, etc. in a round-robbin sequence in the table.

Each row in this table has four entries which store the section and bank identifiers for four selected banks (one per section), each table entry representing a three-way PROC-ID/bank-identifier/section-identifier association for one of the sixteen banks selected for handling one processor request. When the table is organized in PROC-ID columns, each entry need only actually store bank and section identifier values to make the three-way association for each request.

I/O Communications by Bank Address Controls 10

Each bank completes its accessing by latching the DRAM row containing the requested data. At that time, control 10 signals on lines 31–34 to the I/O selection control 21 the section identifiers (5-1, 5-2, 5-3 or 5-4) stored in the current row in the association table for up to four port transfers, determined by how many of the four entries in the row are storing transfer requests.

Then I/O control 21 signals this setup information on bus 22 to the cross-point switch to set up the transfer paths internal to switch 20 required by the identified section/port associations signalled on lines 31–34 between controls 10 and 21. After the switch path set up is done, the next transfer cycle sequence can begin simultaneously between up to four of the section data buses and currently associated port registers.

Then, a transfer cycle sequence comprising four sequential machine cycles is started on the section data bus connected to the bank, during which a selected one-half of the latched row is transferred in four parts (one part per cycle) between the bank latches and the switch set up port registers 6A, 6B, 6C and 6D. The set up port register are the register currently connected with the port identified in an entry in the association table in control 10.

The transfer sequence of four data cycles proceed in parallel for each of the four data buses. When the cycle sequence is complete, the four current entries in the table (for the section/port associations of the currently completed transfers) are set to an available state in a bank availability table in control 10 to make them selectable for handling new processor requests.

Cross-point Switch Operation

During each of the synchronized transfer cycle sequences, control 10 steps to its next set of four entries (representing a set of up to four bank selections) in the association table. That is, these four entries determine the next set of from zero to four section data buses which will be making transfers during the next synchronized transfer cycle sequence, and these entries are read from the table to provide section-bus-identifier/PROC-ID associations, which are signalled on lines 31, 32, 33 and 34 to I/O selection control 21 to control path setups in cross-point switch 20. Lines 31, 32, 33 and 34 respectively correspond to the ports A, B, C and D. Any section data bus not currently having a valid section-bus-identifier/PROC-ID association entry in the table does not have any signal active on its line 31, 32, 33 or 34; and no connection is then made for it during that transfer cycle sequence to any port.

Thus, the cross-point switch 20 makes data-bus-to-port-register selections based on the signals on lines 31, 32, 33 and 34.

Number of Processors

It should be understood however that the invention may support any number of processors which may be switched among the ports, and the permanent CPU port connections of the described embodiment are merely representative of port use in the preferred embodiment. Many other scenarios of the port assignment may be used. The efficiency of operation of the chip may be impacted by the way processors use the ports. For example, chip accessing efficiency might be increased over permanent processor/port assignments by a dynamic assignment of processors to ports. Dynamic port assignment may increase the complexity of processors handling memory accesses. Thus, dynamic port assignment may allow the same processor to be concurrently accessing data in the multiple banks of different chip sections simultaneously, which may be able to utilize chip cycles that might not otherwise get used; in static port/processor assignment, a processor can only be accessing in one bank at a time.

The required data-bus/port-register path connections in cross-point switch 20 must be made before a data transfer can start between the banks and the port registers. The path connections in the cross-point switch are then made at the beginning of the first cycle of each transfer cycle sequence.

Chip I/O Controls

FIG. 1B shows input/output data controls in the chip that control data transfers between the port registers 6A, 6B, 6C and 6D and respective ports A, B, C and D. These I/O port/port-registers data transfers overlap the DRAM operations in the banks. I/O selection control 21 controls these data transfer and starts them when a transfer data sequence is to be made between the ports and the port registers.

In the preferred embodiment, the number of parallel bits provided for each port is by a number of I/O port pins which is an integer submultiple of the number of bits in each data line stored in the port register. The preferred embodiment has 72 pins/port which transfer 72 bits in parallel bits between the port and its port register. Also, the preferred embodiment stores a data line of 2304 bits in each port register—so that each port uses a submultiple of 32. This submultiple determines that 32 transfers are required to transfer all data in a line of 2304 bits between the port and its port register. Bit selectors 7A, 7B, 7C and 7D control these 32 transfers for each port/port-register connection. Signal amplifiers Di/Do 8A, 8B, 8C and 8D connect between the respective ports and their bit selectors to provide signal amplification in both transfer directions.

I/O selection control 21 signals on line 24 when the bit selectors 7 can start a next sequence of transfers, which may be started when the port registers are only partially full. For example, each port register may be filled by four 576 bit "pages" in four parallel transfers for each row stored in bank latches; and as soon as these 576 bits are in the port register, the bit selector 7 may start eight transfers of 72 bits to transfer these 576 bits. The second set of 576 bits may be transferred by the bank to the port register while bit selector 7 is making its first eight transfers of 72 bits from the port register to the port for the first 576 bits, or it may complete earlier, since this timing is not stringent.

Accordingly, most of the 32 transfers for the port may overlap the four transfers from the bank, so that little extra time is needed for the port transfers over the bank transfers, and that extra time may overlap DRAM activities in the bank for its next selection. These overlapping transfer operations are well known multiplexing operations, although not in the environment of this invention.

Hence, multiplexing is used in the preferred embodiment to enable each port to be supported by only 72 I/O pins in parallel to the requesting processor, since a chip generally has a limited number of I/O pins available.

The effect of this type of cross-point switching is to enable any of the 16 DRAM banks to have its data connected to any of the four ports A, B, C and D.

DRAM Bank Structure

Figure 2:
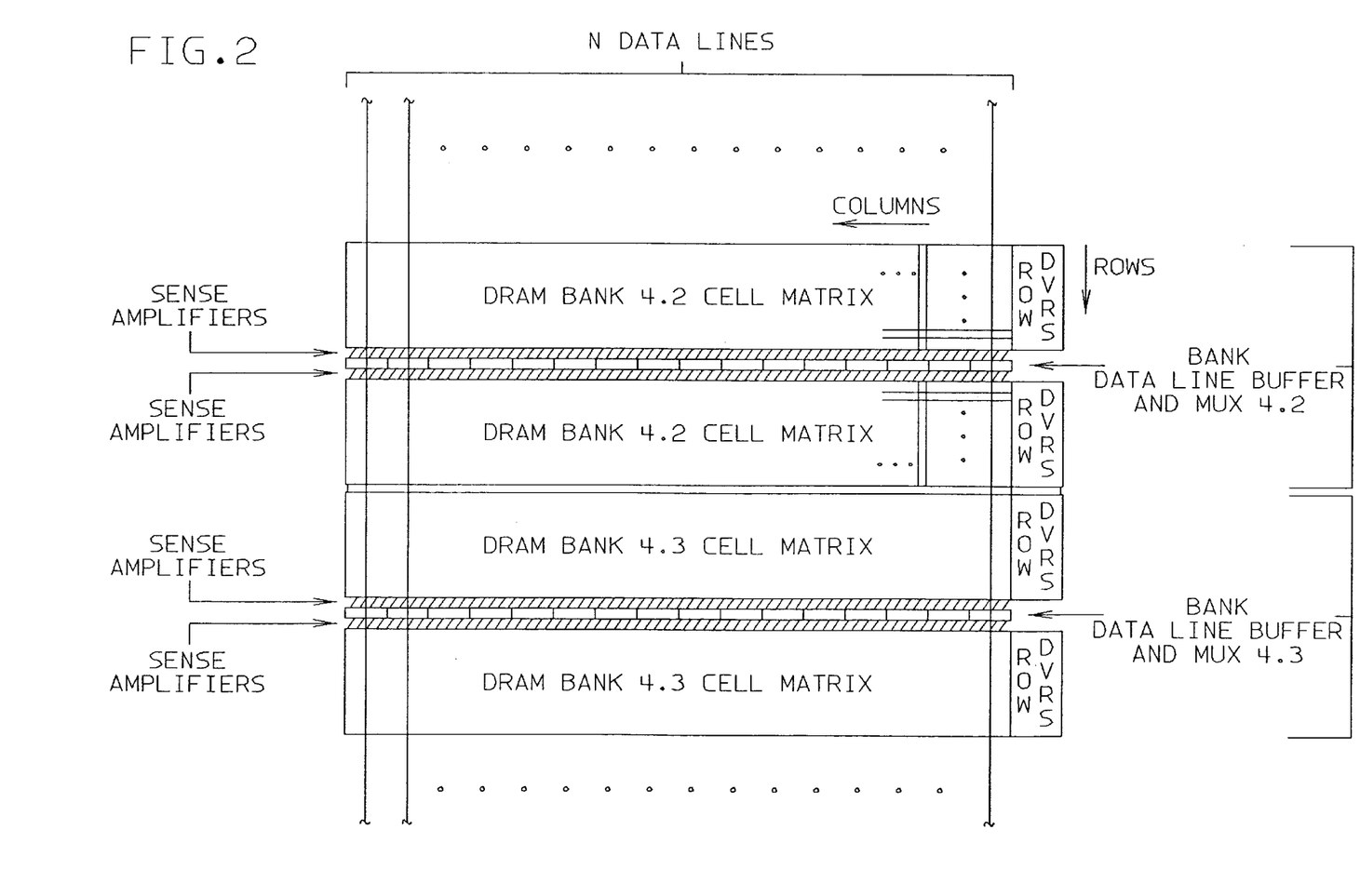
FIG. 2 shows a detailed example of the structure of two DRAM banks in any section of the chip shown in FIGS. 1A and 1B.

FIG. 2 shows the circuit layout within each DRAM bank of banks 4.2 and 4.3. Each DRAM bank contains two matrices of DRAM storage cells on opposite sides of a row buffer and multiplexor, which provide the interface of the bank to the connected data bus 5. The row buffer is connected to two sets of row sense amplifiers, one set connecting to each DRAM matrix. Each DRAM matrix also has connected column drivers, row drivers, sense amplifiers and data latches.

In this embodiment, the row buffer stores a data line containing 4608 data bits, which is the number of data bits in each row in any DRAM matrix. One-half of the row is selected by the requested address as the bank's input or output from/to the section data bus.

The multiplexor provides a "paging mode" type of operation in which it transfers the selected one-half row as four "pages" of 576 bits (one page at a time) between the row buffer and the connected data bus (5-1, 5-2, 5-3 or 5-4) to transfer each 2304 bit one-half data line (i.e. 4×576=2304). Thus, each data bus (5-1, 5-2, 5-3 or 5-4) comprises 576 signal lines which transfer a parallel set of 576 data bits to/from each latched row buffer under multiplexor operation. The sense amplifiers, row buffers, and multiplexors are of the type found in conventional DRAM memories for storing, reading out and recharging data bits in DRAM cells a row at a time in any bank matrix. Each of the 16 banks has the same internal layout. The row buffer and multiplexor circuits in each bank are vertically centered in each cell matrix for parallel communication to the connected data buses. The sense amplifiers are connected to the row buffer for reading data into and out of the matrix. Restore circuits (not shown) of the conventional type are used with the DRAM circuits and are connected to the row buffer and column lines for restoring the charge in each row when it is read out, and periodically to prevent destruction of data by loss leakage.

The restoration process is one of a sequence of steps used in each DRAM data access, and the restoration step slows down accessing in DRAM storage media (compared to accessing data in SRAMs and other semiconductor storage media which do not require a restoration step on readout). However SRAM media have the disadvantage of having much less data density compared to DRAM media (fewer bits per unit of silicon die area). This is caused by a SRAM cell requiring up to 6 transistors per bit cell compared to a DRAM cell requiring only one transistor+storage capacitor per cell. It is well known to those skilled in the art of DRAM cell design how to place part of the cell transistor over or under the storage capacitor to further increase the data density. There is no equivalent structure for SRAM cells known in the current art so the data density ratio of DRAM to SRAM is over 10 to 1.

In this regard, the simultaneous bank accessing by this invention takes advantage of the high data density in the DRAM media (compared to the lower data density in SRAM media) to outweigh the DRAM disadvantage of restoration time loss not occurring in the SRAM media. The simultaneous asynchronous accessing in plural DRAM banks in all sections and their simultaneous transfer of data to/from the output port registers allow multiple data requests to be simultaneously accessed while previously requested data are being transferred to the processors over a multiple output port interface. Both data write and data read accesses can occur simultaneously in different banks in the chip.

In summary during a read cycle sequence for any bank, memory cell data is latched into each bank's sense amplifier latches. This operation can occur simultaneously with, or asynchronously to, read or write operations by other banks within the same memory section. Sense amplifier latch information from any bank within the same memory section is then time multiplexed onto parallel lines in each section data bus 5 via a tri-stateable row buffer resident in each bank. Time scheduling for this multiplexing function is controlled for the I/O selection control 21. Immediately after transfer of data bus information to the proper port register 6, the selected bank can either restore in preparation for a new row address, or can operate in DRAM page mode, maintaining control of the data bus, and transferring another 576 bits to the proper port register. After some number of such transfers, as controlled by the I/O selection control 21, control of the shared data bus is relinquished and passed to another bank in the same memory section.

A write cycled sequence operates in the same manner but with a transfer in the other direction relative to the port.

Burst Mode Operation

As previously explained herein, each bank read operation transfers 2304 bits of a 4608 bit latched row in four sets of 576 parallel bits, herein called "pages", to a port register; and then the respective pages in the port register are transferred in thirty-two 72 bit parallel units to a connected port, where each 72 bit unit is outputted to the requesting processor. In a memory read operation, the four pages of each outputted row are transferred from the chip in a "burst" sequence of 72 bit parallel units. Each burst sequence begins by outputting the "first" 72 bit unit in the accessed row, which is the 72 bit unit containing the byte addressed by the current processor request being accessed.

But before the first 72 bit unit can be outputted from the port register, the data must previously have been transferred from the bank to the port register in 576 bit parallel units in this embodiment. Thus the burst sequencing of the data in an accessed row requires that the "first" 576 bit page of the row be transferred from the bank, and the first 576 bit unit is the unit containing the byte addressed by the current processor request being accessed, and this 576 bit unit therefore contains the first 72 bit unit of the row.

The general procedure for determining a first data transfer unit in a DRAM row is well known by DRAM page selection means taught in the prior art, and is used as an element in the subject invention. This first page determination is done using the three page select bits shown in FIG. 5 taken from the processor address which is done by circuits (not shown) within address control 10 in FIG. 1A, from which the determination of the first page, and each following page, is signalled on lines 25 from control 10 to a four-way select register 26, which enables only the 576 line providing the first page in each of four section buses, each bus comprising 2304 lines. Each of the next pages are likewise sequentially enabled under control signals received on line 25 to register 26. (It will be recalled that four banks, one per section, may be simultaneously outputting a latched row— the banks being selected by an active four of the address select buses 11-1 through 14-4.)

Of the 3 page bits in the address shown in FIG. 5, the 1st of these 3 bits is used to select one-half of the latched row. The other 2 of the 3 page bits select the first page of the four 576 bit pages in each latched row for readout to a selected port register. The other three pages in each row are selected sequentially following the first page in the increasing address direction, and wraps to the lowest address page in the row when necessary to select a next of the four pages.

Signals on buses 31 through 34 from control 10 to control 21 communicate the locations of the first 72 bit unit in each of the pages transmitted to the respective port registers simultaneously on each of the four section buses. These bus locations for each of these first 72 bit units is provided by control 21 on bus 24 to all of bit selectors 7A, 7B, 7C and 7D, so each can independently select its respective first 72 bit unit of a row. Then the bit selectors 7A, 7B, 7C and 7D sequentially select the remaining 31 units of the row from each page when each page is provided in the respective port register.

In FIG. 5, 3 bits are shown for selecting each of the eight 72 bit units in each of the pages immediately after each pages is sent to the port register. When the first 72 bit unit is not at the lowest address in the first page, it may be necessary for control 21 to send signals to the bit selectors for wrapping the 72 bit unit address back to the beginning of the first page of the current row in the port register.

Main Storage Interface

The preferred embodiment of the invention as an L2 cache includes an interface between the DRAM array and the main storage so that operations between the cache and main storage do not busy the ports to the connected processors. When circuitry labelled "directory logic and tag array" in FIG. 3 determines (according to cache management algorithms well known in the art) that data must be transferred between the main storage and the cache array (or vice versa), a sequence similar to the operations of a processor port as previously described is initiated.

Using a cast-out (transfer of data from one DRAM cache bank to main storage) as an example, Bank address control 10 would send the read address to a bank, and control the transfer of the resulting data in the sense amplifier latches to register 26 via the built in four way selector (a simplified version of the crosspoint switch used for the port registers).

Other circuits (not shown) in FIG. 1A generate a corresponding main storage address representing where the data are to be stored. When the main storage is ready to recieve the data, the contents of register 26 is multiplexed by the burst mode address controls 27 to the memory via the data bus 29.

Fetching from main storage to the cache on a cache miss proceeds in a similar fashion with the data from main storage filling register 26 prior to writing the appropriate bank. Bank controls 10, bus 31–34, and I/O selection control 21 may also send the data directly to the port register of the requesting processor in the order of the requested data first burst algorithms well known in the art of cache design.

Main Storage (L3) Configuration

FIG. 4 shows an example of a computer system containing an L3 main storage (main memory) configuration, made from a plurality of DRAM chips of the type shown in FIGS. 1A and 1B, but without items 25, 26, 27, 28 and 29 being in these chips because these items are not needed in this main memory configuration. Although two chips 42 and 43 are shown, any number of chips may be used in the main memory configuration depending on the capacity required, since the memory capacity increases as the number of chips increases.

The ports of each of chips 42 and 43 are respectively connected to buses of the four processors, as explained for the buses connecting to the chip in FIGS. 1A and 1B.

The memory real addresses are divided up among the banks in both chips 42 and 43. For example, suppose the memory has 512 MegaBytes (MB) of storage, which is divided between two chips, each containing 256 MB of storage. In such 512 MB memory, each of the 16 banks in each chip may contain 16 MB of storage.

Many different manners of assigning the memory addresses to the plural chips 42 and 43 may be used. Any of several types of memory interleaving may be implemented, such as putting even word or line addresses in chip 42, and putting odd word or line addresses in chip 43. If no interleaving is used, one chip may contain addresses 0 to 256 MB, and the other chip may contain addresses 256 MB to 512 MB.

The processor address buses also connect to a chip select address decoder circuit 41 which steers each processor request to the correct chip containing the processor requested address. Lines 44 and 46 from circuts 41 select and enable one of chips 42 and 43 for reception of the current processor address to the chip. For even/odd line-address interleaving, the even/odd bit at the data-line boundary location in the address (a well-know concept) may be detected by circuit 41 to steer the address between the two memory chips, in which even lines are stored in chip 42 and odd lines are stored in chip 43. For no interleaving, the highest-order bit of the processor address may be used to steer the address to the correct memory chip. Many other interleaving and non-interleaving methods may be apparent to those in the art.

It should be understood that the embodiments described herein have been provided by way of example and not by way of limitation. In light of the foregoing description, many modifications and variations exist which do not depart from the scope and spirit of the invention as defined by the appended claims.

We claim:

1. A semiconductor memory chip having thereon a large number of DRAM memory cells for use in a computer memory, comprising the following elements being within the chip:

a plurality of memory sections, each memory section containing a plurality of DRAM banks, each DRAM bank containing a plurality of the DRAM cells, each DRAM bank also containing a latch buffer for latching a binary state of a selected row of DRAM cells in the DRAM bank, the latch buffer inputting/outputting data for the selected row, a plurality of section data buses, each section data bus being connected to the latch buffers of the plurality of DRAM banks of one of the memory sections, bank address control circuits for receiving memory access request addresses and for selecting one of the DRAM banks containing each requested address, and the DRAM bank selecting the row containing the requested address and setting the latch buffer of the DRAM bank to a bit state of the row while up to all of the other DRAM banks in all of the sections in the chip are simultaneously accessing other requested data, a plurality of input/output ports for transferring data signals between the chip and processors, and a cross-point switch within the chip for simultaneously connecting the section data buses to the input/output ports along selected switched paths, the switched paths independently transferring randomly accessed data between DRAM banks currently selected for accessing requested addresses and input/output ports connected to processors providing the requested addresses, an input/output selection control connected to the cross-point switch for controlling selections of switched paths in the cross-point switch in response to current requests from processors, a plurality of port registers respectively associated with the input/output ports, and the port registers connected to one side of the switched paths and the section data buses connected to the other side of the switched paths in the cross-point switch, and a multiplexor connected between each port and an associated port register to enable a subset of bits in the port register to be transferred in parallel between the port register and the associated port, the subset of bits being a unit of parallel transfer between the chip and a requesting processor, and no multiplexer being required in the chip when all bits in the port register are transferred in parallel between the port register and the associated port.

2. A semiconductor chip having thereon a large number of DRAM memory cells as defined in claim 1, further comprising within the chip:

any of the section data buses transferring a plurality of parallel groups of bits of the row in the latch register of one of the DRAM banks currently connected to the section data bus and one of the port registers connected to the same switched path as the section data bus.

3. A semiconductor chip having thereon a large number of DRAM memory cells as defined in claim 2, further comprising within the chip:

a clocking input to the chip being provided by processor clocking circuits, switched paths in the cross-point switch being selected and set up prior to a data transfer on the section data buses, and parallel data transfers between the port registers and section data buses being synchronized by the clocking input.

4. A semiconductor chip having thereon a large number of DRAM memory cells as defined in claim 3, further comprising within the chip:

data transfers on the plural section data buses being provided in parallel from different DRAM banks in different sections for different processor memory access requests.

5. A semiconductor chip having thereon a large number of DRAM memory cells as defined in claim 4, further comprising within the chip:

the data transfers provided in parallel on different section data buses being bidirectionally independent of each other.

6. A semiconductor chip having thereon a large number of DRAM memory cells as defined in claim 5, further comprising within the chip:

a switch for connecting the row latch in each DRAM bank to one of the section data buses for an input/output cycle when the DRAM bank has a row latched in its row buffer.

7. A semiconductor chip having thereon a large number of DRAM memory cells as defined in claim 6, further comprising within the chip:

the plurality of ports being connected to different processors, and plural bidirectional data transfer paths in the cross-point switch being set up prior to each data transfer occurring between the DRAM banks and the section data bus, and the data transfer paths connecting the section data buses to the ports connected to processors requesting the data being transferred on the section data buses.

8. A semiconductor chip having thereon a large number of DRAM memory cells as defined in claim 7, further comprising within the chip:

each of the data transfers on the plurality of section data buses being made during a predetermined number of processor cycles.

9. A semiconductor chip having thereon a large number of DRAM memory cells as defined in claim 8, further comprising within the chip:

one or more processor cycles during simultaneous accesses in a plurality of DRAM banks overlapping one or more processor cycles during simultaneous transfers by a different set of DRAM banks on a plurality of section data buses.

10. A computer system having a plurality of chips providing a main memory of the computer system, each chip internally structured as defined in claim 1, further comprising a plurality of processors having data buses respectively connected in parallel to plural input/output data ports on each chip, chip selection circuits connected to address signal lines from the processors for receiving each address signalled by any requesting processor for selecting the chip having the address, the chip receiving the address signalled to the memory selection circuits for selecting a memory bank containing requested data when the address is located in the bank, and the selected bank in the chip accessing the requested data at the address, and the chip presenting the requested data to the requesting processor through one of the input/output data ports on the chip.

11. A computer system including a main memory and a plurality of processors; a shared cache memory for the plurality of processors being comprised of at least one other chip made as defined in claim 1, further comprising the plurality of processors respectively connected to independent ports on the chip, and the chip signalling the main memory's chip selection circuits for cancelling an access of requested data in main storage when the request obtains requested data from the shared cache.

* * * * *